(12) United States Patent
Shen

(10) Patent No.: US 9,196,379 B2
(45) Date of Patent: Nov. 24, 2015

(54) MAGNETIC SHIFT REGISTER WITH PINNING STRUCTURE

(75) Inventor: Kuei-Hung Shen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 435 days.

(21) Appl. No.: 13/338,285

(22) Filed: Dec. 28, 2011

(65) Prior Publication Data

US 2013/0168786 A1 Jul. 4, 2013

(51) Int. Cl.
*H01L 29/82* (2006.01)
*G11C 19/08* (2006.01)
*G11C 11/14* (2006.01)
*H01L 21/00* (2006.01)

(52) U.S. Cl.
CPC ............ *G11C 19/0841* (2013.01); *G11C 11/14* (2013.01)

(58) Field of Classification Search
None
See application file for complete search history.

(56) References Cited

U.S. PATENT DOCUMENTS

| | | | |
|---|---|---|---|
| 6,358,757 B2 * | 3/2002 | Anthony | 438/3 |
| 7,416,905 B2 | 8/2008 | Chen et al. | |
| 7,919,413 B2 | 4/2011 | Chen | |
| 2002/0041515 A1 * | 4/2002 | Ikeda et al. | 365/158 |
| 2003/0099867 A1 * | 5/2003 | Nishikawa et al. | 428/694 SG |
| 2004/0057343 A1 * | 3/2004 | Murakami et al. | 369/13.41 |
| 2005/0270828 A1 * | 12/2005 | Motoyoshi | 365/158 |
| 2007/0087454 A1 | 4/2007 | Chen et al. | |
| 2008/0225577 A1 * | 9/2008 | Hosotani et al. | 365/158 |

OTHER PUBLICATIONS

Fukami et al., "Large thermal stability independent of critical current of domain wall motion in Co/Ni nanowires with step pinning sites", Journal of Applied Physics 108, issued on Dec. 8, 2010, pp. 1139141-1 to 13914-4.

Fukami et al., "Intrinsic Threshold current density of domain Wall Motion in Nanostrips with perpendicular magnetic anisotropy for use in low-write-current MRAMs", IEEE Transactions on Magnetics, vol. 44, No. 11, issued on Nov. 2008, pp. 2539-2542.

Suzuki et al., "Evaluation of Scalability for Current-Driven Domain Wall Motion in a Co/Ni MultilayerStrip for Memory Applications", IEEE Transactions on Magnetics, vol. 45, No. 10, issued on Oct. 2009, pp. 3776-3779.

Suzuki et al., "Analysis of current-driven domain wall motion from pinning sites in nanostrips with perpendicular magnetic anisotropy", Journal of Applied Physics 103, issued on Jun. 11, 2008, pp. 113913-1 to 113913-6.

(Continued)

*Primary Examiner* — Michael Jung
(74) *Attorney, Agent, or Firm* — Jianq Chyun IP Office

(57) ABSTRACT

A magnetic shift register includes a first supporting layer, a second supporting layer, a first pinning material layer, and at least one magnetic memory track. The first supporting layer has trenches on a first surface extending along a first direction. The second supporting layer is filled in the trenches, wherein the first support layer and the second support layer have at least a portion substantially equal in height. The first pinning material layer is disposed between the first supporting layer and the second supporting layer, wherein a plurality of end surfaces of the first pinning material layer are exposed on the first surface. The magnetic memory track extending along a second direction on the first surface is disposed over the first support layer, the first pinning material layer, and the second support layer, wherein the second direction is not the same or perpendicular to the first direction.

12 Claims, 8 Drawing Sheets

(56) References Cited

OTHER PUBLICATIONS

Martinez et al., "Thermally activated domain wall depinning in thin strips with high perpendicular magnetocrystalline anisotropy", Journal of Applied Physics 106, issued on Aug. 26, 2009, pp. 043914-1 to 043914-5.

Atkinson et al., "Controlling domain wall pinning in planar nanowires by selecting domain wall type and its application in a memory concept", Applied Physics Letters 92, issued on Jan. 16, 2008 pp. 022510-1 to 022510-3.

* cited by examiner

MAGNETIC SHIFT REGISTER WITH PINNING STRUCTURE

BACKGROUND

1. Technical field

The disclosure relates to magnetic shift register with pinning structure.

2. Related art

Memory device for storing binary data has wide application. The capacity of memory device is required more and more to adapt various applications in electronic apparatus. In addition, the operation speed is also required be much faster. Recently, the memory device designed as a magnetic shift register has been proposed.

The operation mechanism for the magnetic shift register is based on the movement of magnetic domain wall in a memory track, which have a plurality of magnetic domains. Each magnetic domain serves as a memory cell to store one binary data. The magnetic materials are generally classified into in-plane magnetic anisotropy (IMA) material and perpendicular magnetic anisotropy (PMA) material. FIG. 1 is a drawing, schematically illustrating a conventional magnetic shift register with IMA material. In FIG. 1, an IMA memory track 100 has many magnetic domains 102. In each magnetic domain 102, the magnetization directions 106 thereof as indicated by arrows are lying in the plane. The magnetization direction 106 in each magnetic domain 102 is used to decide the binary data stored in the magnetic domain 102 as "0" or "1". When the magnetization directions 106 for the two adjacent magnetic domains 102 are different, a domain wall 108 is then created therebetween, as indicated by solid line. When the magnetization directions 106 for the two adjacent magnetic domains 102 are same, no domain wall is created, as indicated by dashed line. A reading device 110, such as magnetic tunnelling junction (MTJ) device, can be implemented adjacent to the memory track 100 to sense the magnetoresistance induced from the passing magnetic domain 102, so as to read the binary data. The write device 112 is also implemented adjacent to the memory track 100 to change the magnetization direction 106 as intended. In order to shift the magnetic domains 102 to pass the write device 112 or the reading device 110, a driving electron current is applied to move the domain walls 108, forward or backward.

In order to have the stable location of domain wall 108, a pinning structure 104, such as a notch structure is formed to stabilize the domain wall 108.

For the PMA material, the magnetization directions 106 in the magnetic domains are perpendicular to the thin film. With a magnetic anisotropic constant (Ku), the magnetic domains of PMA Materials are quite narrow, so that the memory density can be much improved due to the reduced width of the domain wall. FIG. 2 is a drawing, schematically illustrating a conventional magnetic shift register with PMA material. In FIG. 2, the memory track 100 is made by PMA material. In this structure, the magnetization direction 106 in magnetic domain 102 is perpendicular to the plane of the memory track 100. The operation is similar to the magnetic shift register with IMA material as described in FIG. 1.

The magnetic shift register with PMA material may have very narrow domain wall. It may even be less than 10 nm. However, the semiconductor fabrication process based on lithographic and etching processes has limitation of line resolution and therefore is difficult to reduce device size. How to improve the memory density based on the available photolithographic process is still developed.

SUMMARY

A magnetic shift register with pinning structures and the fabrication methods are introduced herein.

In an embodiment, a magnetic shift register is provided. The magnetic shift register includes a first supporting layer, a second supporting layer, a first pinning material layer, and at least one magnetic memory track. The first supporting layer has trenches on a first surface extending along a first direction. The second supporting layer is filled in the trenches, wherein the first support layer and the second support layer have at least a portion substantially equal in height. The first pinning material layer is disposed between the first supporting layer and the second supporting layer, wherein a plurality of end surfaces of the first pinning material layer are exposed on the first surface. The magnetic memory track extending along a second direction on the first surface is disposed over the first support layer, the first pinning material layer, and the second support layer, wherein the second direction is not the same or perpendicular to the first direction.

In an embodiment a method for fabricating magnetic shift register includes providing a substrate. Further, a first supporting material layer is deposited on the substrate. The first material layer is patterned to form a plurality of trenches extending along a first direction. A first pinning material layer is deposited conformal over the trenches. A second supporting material layer is deposited over the first pinning material layer to fill the trenches at least fully covering sidewalls of the trenches. A polishing process is performed over the substrate at least on the second supporting material layer and then the pinning material layer until the first supporting material layer is exposed, wherein a residual portion of the first pinning material layer is on the sidewalls of the trenches. At least one magnetic memory track is formed over the first supporting layer, the first pinning material layer, and the second supporting layer, extending along a second direction, wherein the second direction is not the same or perpendicular to the first direction.

Several exemplary embodiments accompanied with figures are described in detail below to further describe the disclosure in details.

DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION

Figure 1:
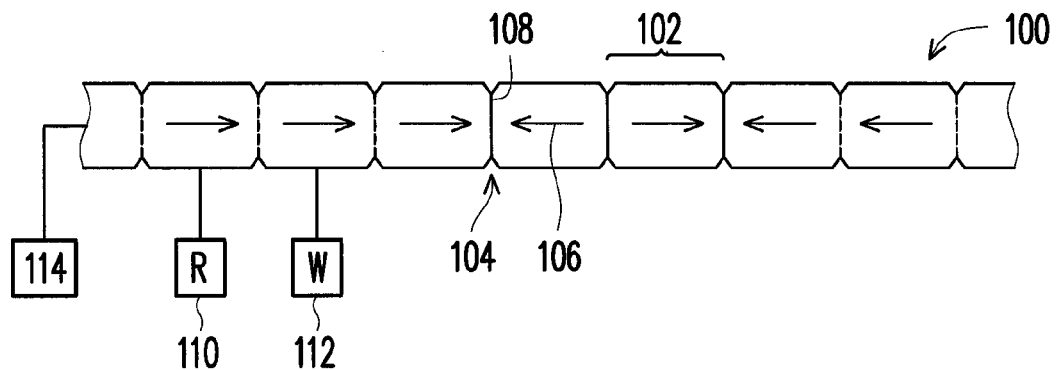
FIG. 1 is a drawing, schematically illustrating a conventional magnetic shift register with IMA material.
Figure 2:
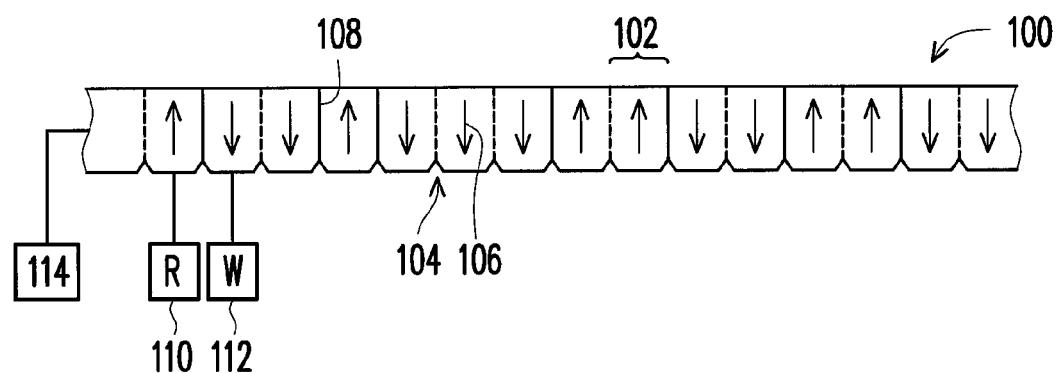
FIG. 2 is a drawing, schematically illustrating a conventional magnetic shift register with PMA material.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure provides a magnetic shift register with pinning structure for pinning the domain wall of the magnetic shift register and the fabrication method accordingly.

When a memory track with the PMA material is taken for the magnetic shift register, the memory density can be greatly improved. In order to stably pin the domain wall, the pinning structure is usually used. The domain walls for the PMA material can have narrow width, such as 5-20 nm. The pinning structure can be a notch, protrusion or a heterogeneity material to the magnetic memory track, for example. However, the disclosure is not limited to PMA materials.

Figure 3:
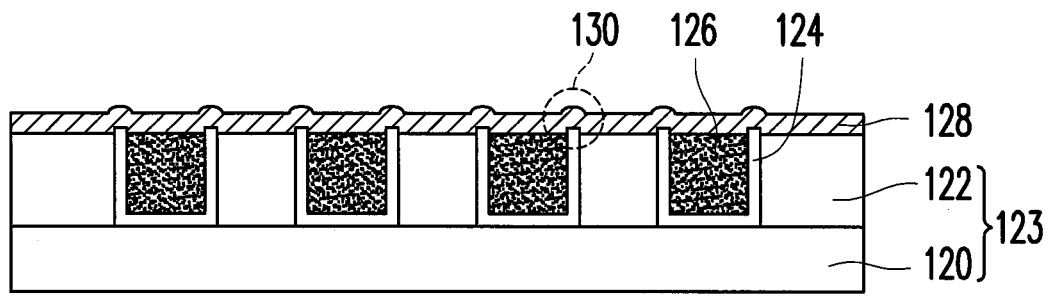
FIG. 3 is a schematic drawing, illustrating a cross-sectional structure of a magnetic shift register, according to an embodiment.
Figure 4:
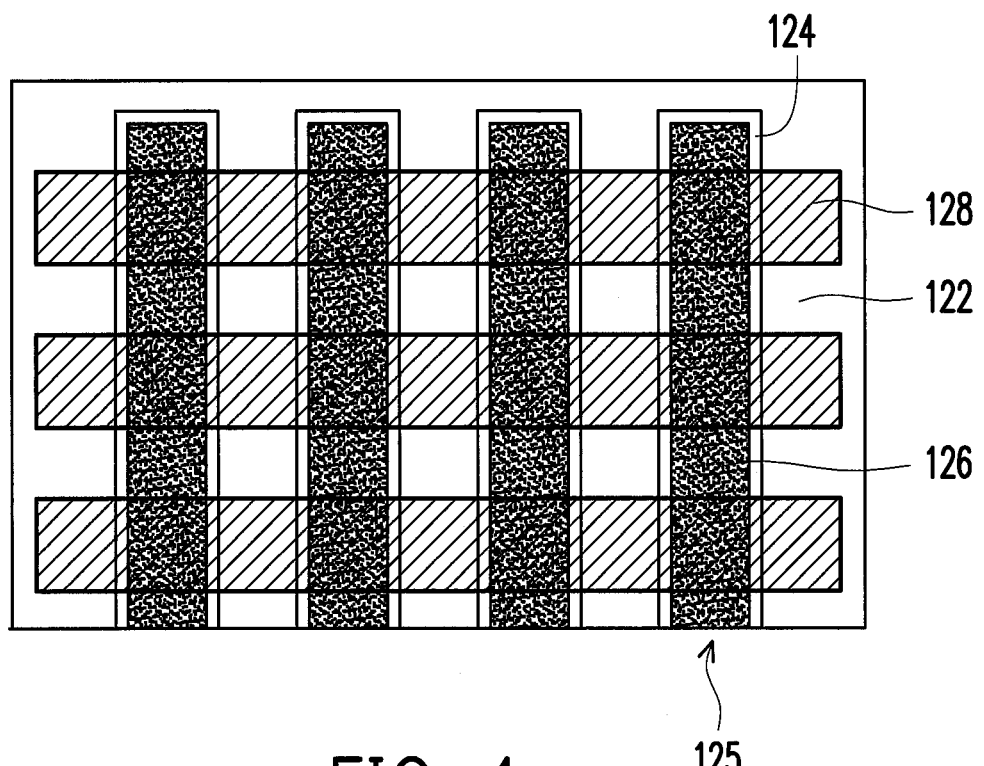
FIG. 4 is a schematic drawing, illustrating a top view structure of a magnetic shift register with respect to FIG. 4, according to an embodiment.

FIG. 3 is a schematic drawing, illustrating a cross-sectional structure of a magnetic shift register, according to an embodiment. FIG. 4 is a schematic drawing, illustrating a top view structure of a magnetic shift register with respect to FIG. 4, according to an embodiment.

In FIG. 3 with FIG. 4, the structure of a magnetic shift register includes a first supporting layer 123 having a plurality of trenches 125 indicated in FIG. 4 extending along a first direction. The first supporting layer 123 in this example can be formed by combination of a substrate 120 and a material layer 122 disposed on the substrate 120. However, the first supporting layer 123 can also be a single material layer.

The material layer 122 is patterned to have multiple stripe openings to expose the substrate 120, so that the trenches are formed. Alternatively, the openings can also be the trenches without exposing the substrate 120. As can be understood, there are different options to form the trench in the first supporting layer 123.

A pinning material layer 124 is formed at least on a sidewall of each of the trenches. In this embodiment, the pinning material layer 124 is also formed on the bottom surface of the trenches. A second supporting layer 126 is filled in the trenches on the pinning material layer 124, wherein the heights of the first support layer 123 and the second support layer 126 are substantially equal. The pinning material layer 124 is sandwiched between the first support layer 123 and the second support layer 126. At least one magnetic memory track 128 is disposed over the first support layer 123, the pinning material layer 124, and the second support layer 126, extending along a second direction. The second direction is substantially perpendicular to the first direction. In general, the second direction just needs to be different from the first direction. Each magnetic domain in the magnetic memory track 128 is defined by adjacent two crossing locations with the pinning material layer 124. The pinning material layer 124 forms the pinning structure 130. A thickness of the pinning material layer 124 can be narrowed down to a range of domain wall width, such as 5-20 nm, for the PMA material.

The pinning material layer 124 can be directly contacting with the magnetic memory track 128 and the pinning material layer 124 is a heterogeneity material to the magnetic memory track 128. Alternatively, a height of the pinning material layer 124 can be different from the heights of the first support layer 123 and the second support layer 126 by protruding or indent with a predetermined difference. The height difference of the pinning structure 130 can provide the notch effect on the magnetic memory track 128. The domain wall can be pinned by the pinning structure 130 at the location of the pinning material layer 124. Various embodiments for the structure of magnetic shift register are to be described later.

The structure of above embodiment with the narrow width of the pinning structure can be formed by semiconductor fabrication process.

Figure 5A:
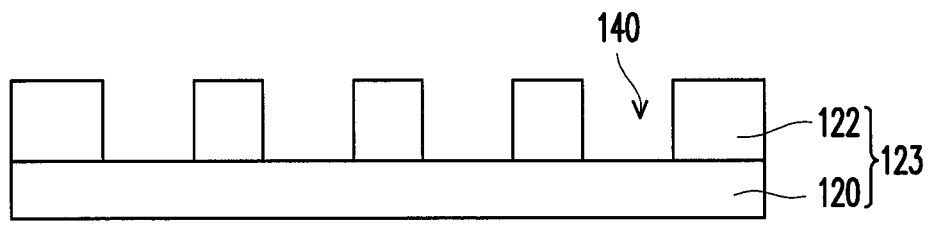
FIGS. 5A-5D are cross-sectional drawings, schematically illustrating the fabrication method for magnetic shift register.

FIGS. 5A-5D are cross-sectional drawings, schematically illustrating the fabrication method for magnetic shift register. In FIG. 5A, a substrate 120 is provided. A material layer 122 is formed on the substrate 120. The material layer 122 is patterned by lithographic and etching processes to form multiple stripe openings 140 to expose the substrate 120, in which the openings are extending along a direction. As described in FIG. 3, the substrate 120 and the material layer 122 may be combined together as a single structure with the trenches. In this situation, the substrate 120 and the material layer 122 are the same material as a single material layer. Also, the trenches can also be directly formed in the material layer 122 without exposing the substrate 120. In the embodiment of FIG. 5A, the openings 140 are taken as the example to form the trenches.

Figure 5B:
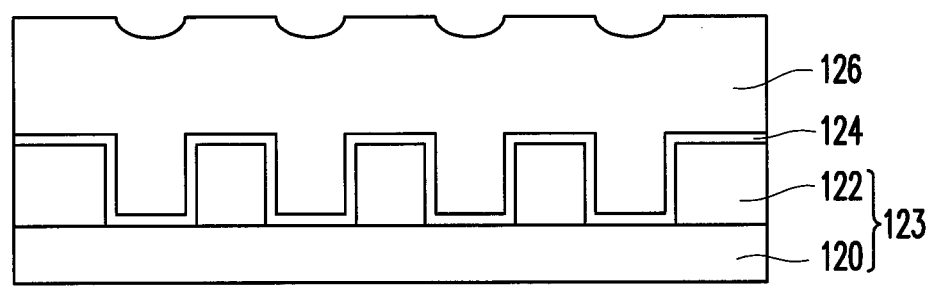
Figure 5C:
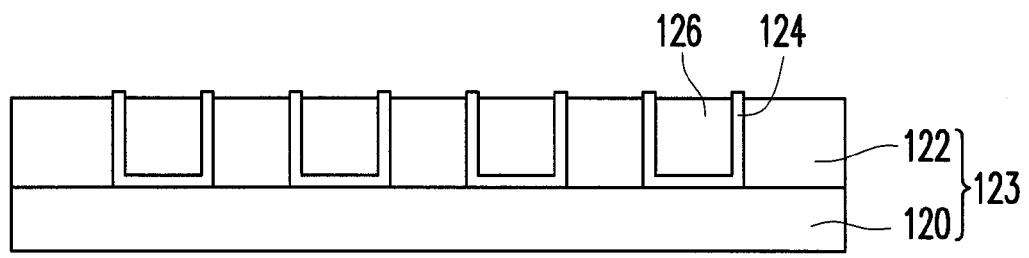

In FIG. 5B, second supporting layer 126 is deposited over the material layer 122 and at least fills the openings 140. Because the pinning material layer 124 has formed over the material layer 122 at the side wall and bottom of the trenches, the pinning material layer 124 is under the second supporting layer 126. In FIG. 5C, a polishing process, such as chemical mechanical polishing (CMP) process, is performed to polish the second supporting layer 126 and then a top portion of the pinning material layer 124 until the material layer 122 is exposed. It can be noted that materials of the material layer 122 and second supporting layer 126 can be the same. In the embodiment, the material of the pinning material layer 124 is different from the material layers 122 and second supporting layer 126. Under the polishing process, due to difference of polishing rates for different materials, the pinning material layer 124 may be concaving down by a sufficient height difference.

Figure 5D:
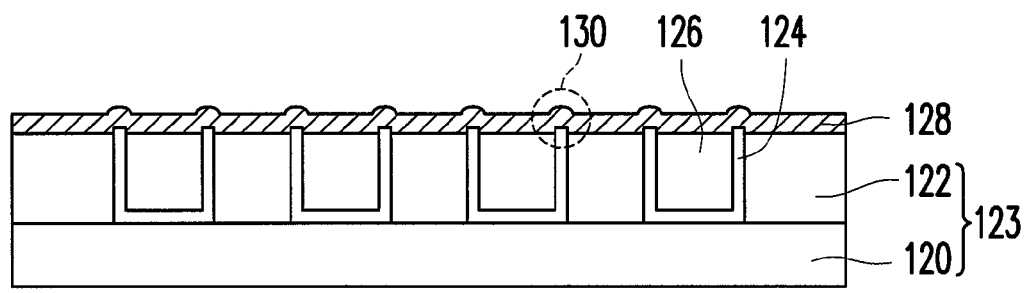

In FIG. 5D, the magnetic memory track 128, extending along a second direction, can be formed over the pinning material layer 124, and the material layer 122 and second supporting layer 126. Due to the protruding part of the pinning material layer 124, the pinning structure 130 can be formed on the magnetic memory track 128. As a result, the memory tracks for the magnetic shift register can be formed. The width of the pinning structure 130 to pin the domain wall can be sufficiently thin for the PMA material.

Figure 6:
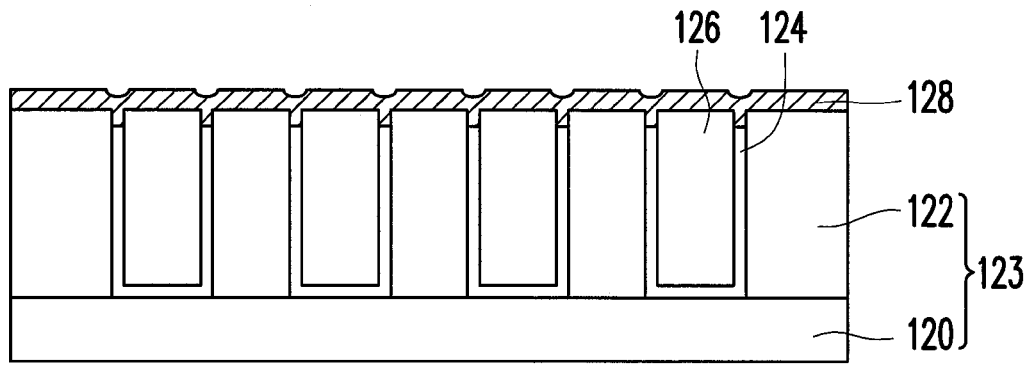
FIG. 6 is a cross-sectional drawing, schematically illustrating a structure of memory track of magnetic shift register, according to an embodiment.

FIG. 6 is a cross-sectional drawing, schematically illustrating a structure of memory track of magnetic shift register, according to an embodiment. In FIG. 6, the height of the pinning material layer 124 in this embodiment is lower than the height of the material layer 122 and second supporting layer 126. In this situation, when the magnetic memory track 128 is formed over the material layers 122 and second supporting layer 126, an indent notch is formed to pin the domain wall.

Remarkably if the pinning material layer 124 is a heterogeneity material to the magnetic memory track 128, the pinning material layer 124 can be the same height as the material layers 122 and second supporting layer 126 in one option.

Figure 7:
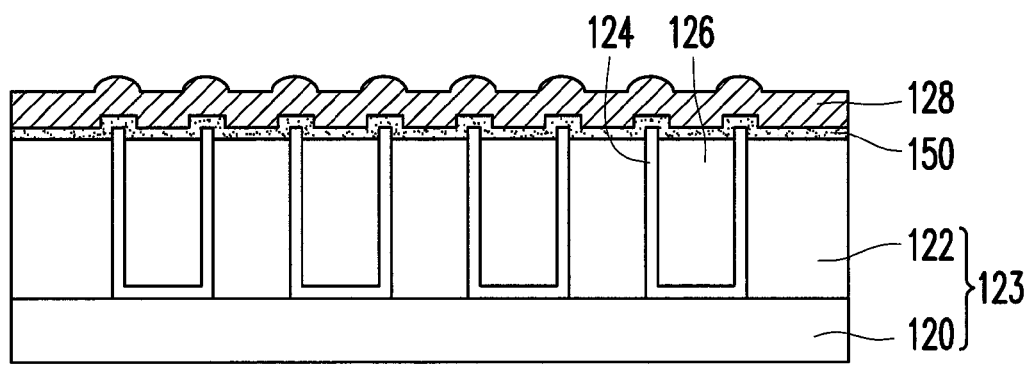
FIG. 7 is a cross-sectional drawing, schematically illustrating a structure of memory track of magnetic shift register, according to an embodiment.

FIG. 7 is a cross-sectional drawing, schematically illustrating a structure of memory track of magnetic shift register, according to an embodiment. In FIG. 7, a further dielectric layer 150 can be formed between the magnetic memory track 128 and the material layers 122, 126. However, the protruding part of the pinning material layer 124 can also produce the pinning effect.

Figure 8:
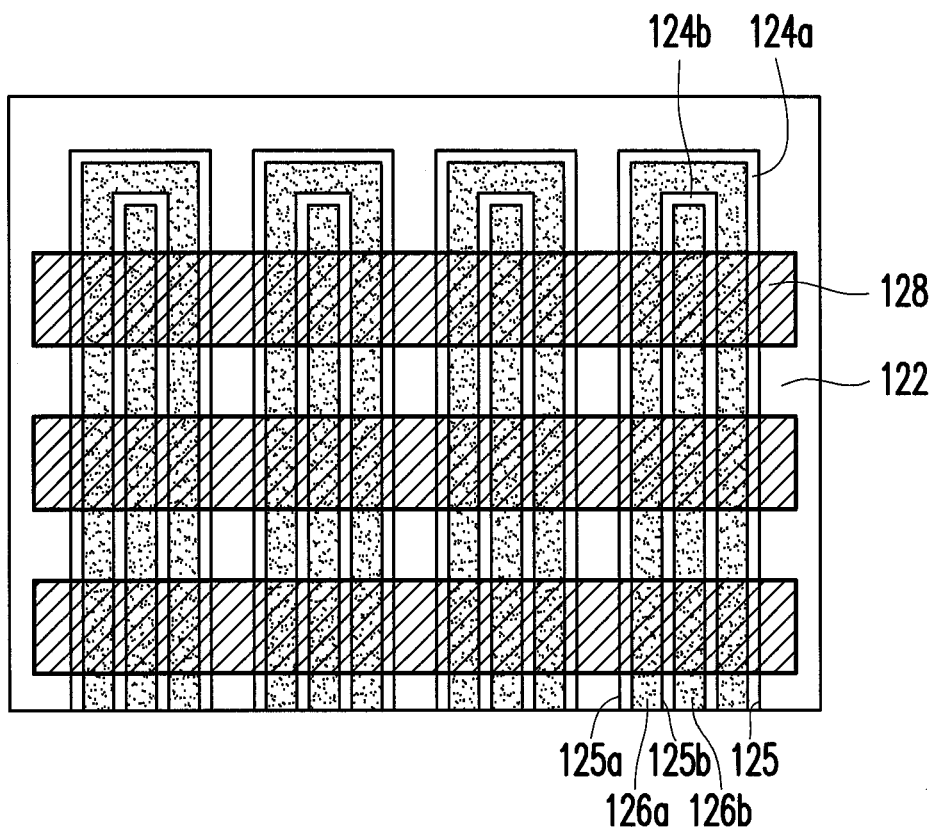
FIG. 8 is a top view drawing, schematically illustrating a magnetic shift register, according to an embodiment.
Figure 9A:
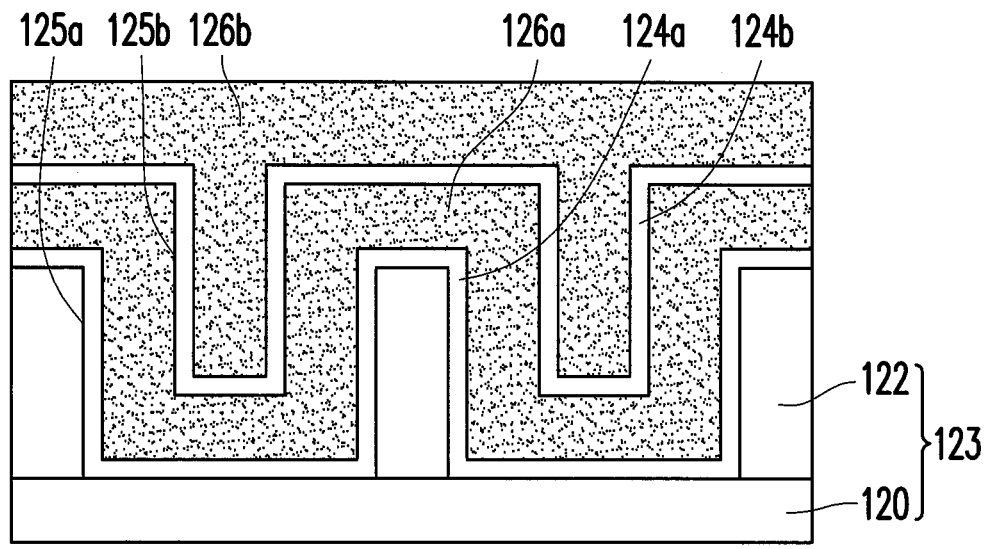
FIGS. 9A-9C are cross-sectional views, schematically illustrating the fabrication process with respect to FIG. 8.
Figure 9B:
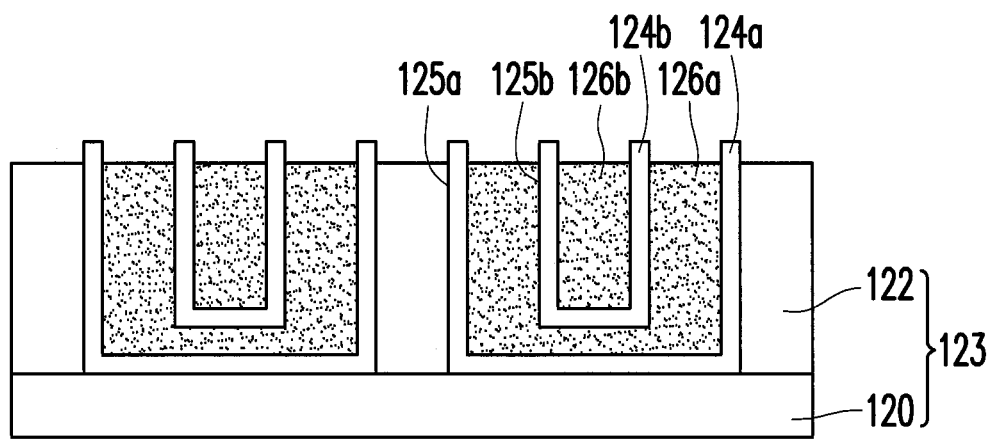
Figure 9C:
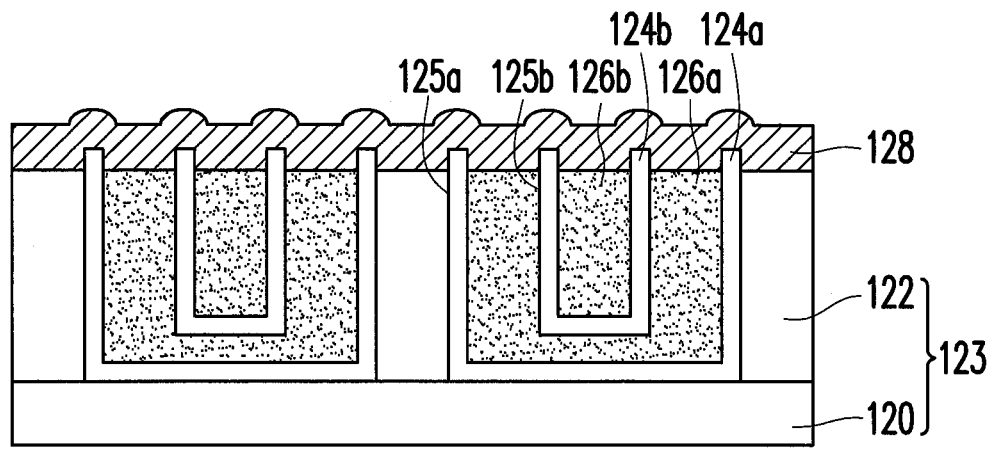

For further reducing the size of magnetic domain, the step in FIG. 5B can be modified. FIG. 8 is a top view drawing, schematically illustrating a magnetic shift register, according to an embodiment. FIGS. 9A-9C are cross-sectional views, schematically illustrating the fabrication process with respect to FIG. 8.

In FIG. 9A with FIG. 8, the step in FIG. 5B can be alternatively replaced by repeating depositing additional pinning material layer 124b and third supporting layer 126b, being conformal to the trench as well. In detail, the trench 125 with the sidewall 125a is formed in the first support layer 123, which is formed from the substrate 120 and the material layer 122, as previously described. The first pinning material layer 124a is deposited over the substrate 120 conformal over the trench 125 and at least covers on the sidewall 125a. The second supporting layer 126a is deposited over the substrate 120 also conformal over the trench 125 with a sidewall 125b. The second pinning material layer 124b is deposited over the substrate, conformal over the trenches 125 and at least covers on the sidewall 125b. The third supporting layer 126b is subsequently deposited over the substrate 120 to fully fill the trench 125.

In FIG. 9B with FIG. 8, a polishing process like the step in FIG. 5C is performed over the substrate 120 until the material layer 122 is exposed. After polishing, second supporting layer 126a, third supporting layer 126b, and the pinning material layers 124a and 124b, these layers are also exposed. In FIG. 9C and FIG. 8, the magnetic memory track 128 of PMA material is formed over the structure in FIG. 9B. As a result, the density of magnetic domains shown in FIG. 9C, each of which is defined by every adjacent two pining material layers, can be further improved with simple fabrication processes.

The second supporting layer 126a has a residual portion of the trenches 125, and the third supporting layer 126b is disposed within the residual portion of the trenches 125 in second supporting layer 126a and surrounded by the first pinning material layer 124a. As a result, the second pinning material layer 124b is disposed between the second supporting layer 126a and the third supporting layer 126b. Multiple end surfaces of the second pinning material layer 124b are exposed.

Figure 10:
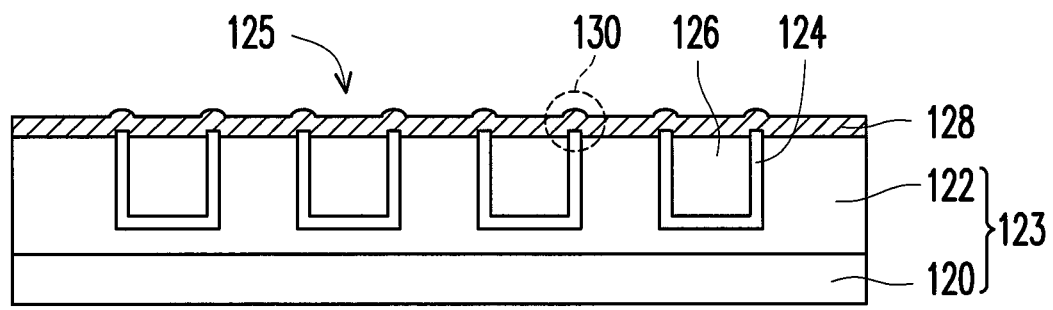
FIG. 10 is a cross-sectional drawing, schematically illustrating a structure of memory track of magnetic shift register, according to an embodiment.

In the embodiments shown above, the trenches are formed by forming openings to expose the substrate. The embodiment with trenches directly formed in the material layer 122 is also shown. FIG. 10 is a cross-sectional drawing, schematically illustrating a structure of memory track of magnetic shift register, according to an embodiment. In FIG. 10 comparing to FIG. 5A, the trenches 125 are just formed in the material layer 122 without exposing the substrate 120. The subsequent fabrication processes in FIG. 5B-5D are the same.

The disclosure has proposed the pinning structure for pinning the domain wall. The width of the pinning structure can be effectively reduced based on the semiconductor fabrication process. This manner is suitable for the PMA material with the horizontal memory track to increase the memory capacity.

According to the disclosed embodiments, the trench can be sufficiently reduced without increasing difficulty of the fabrication process. Then, the pinning width of the pinning structure 130 can be sufficiently narrow as well, based on the simple control of the deposition thickness of the pinning material layers. The disclosure can effectively reduce the size of magnetic domain and the domain wall, particularly to the PMA material.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A magnetic shift register, comprising:
    a first supporting layer having a first surface and a plurality of trenches on the first surface extending along a first direction;
    a second supporting layer, filled in the plurality of trenches, wherein the first supporting layer and the second supporting layer have at least a portion substantially equal in height;
    a first pinning material layer, disposed between the first supporting layer and the second supporting layer, wherein end surfaces of the first pinning material layer is exposed by the first surface, wherein a height of each of the end surfaces of the first pinning material layer is higher than a height of the first surface; and
    at least one magnetic memory track extending along a second direction on the first surface, disposed over the first support layer, the first pinning material layer, and the second support layer, wherein the second direction is not the same as the first direction, wherein portions of the at least one magnetic memory track respectively at the end surfaces of the first pinning material layer are protrudent.

2. The magnetic shift register of claim 1, further comprising:
    a third supporting layer, wherein the second supporting layer has a residual portion of the plurality of trenches, and the third supporting layer is disposed within the residual portion of the plurality of trenches in the second supporting layer and surrounded by the first pinning material layer; and
    a second pinning material layer, disposed between the second supporting layer and the third supporting layer, wherein end surfaces of the second pinning material layer is exposed by the first surface, wherein a height of each of the end surfaces of the second pinning material layer is higher than the height of the first surface, wherein portions of the at least one magnetic memory track respectively at the end surfaces of the second pinning material layer are protrudent.

3. The magnetic shift register of claim 1, wherein the magnetic memory track is directly contacting with the first pinning material layer, the first supporting layer, and the second supporting layer, wherein the first pinning material layer, the first supporting layer, and the second supporting layer are made of dielectric material.

4. The magnetic shift register of claim 1, further comprising a dielectric layer disposed on the first support layer, the first pinning material layer, and the second support layer.

5. The magnetic shift register of claim 1, wherein the magnetic memory track is a perpendicular magnetic anisotropy (PMA) material.

6. The magnetic shift register of claim 1, wherein the second direction is perpendicular to the first direction.

7. A method for fabricating magnetic shift register, comprising:
   providing a substrate;
   depositing a first supporting layer on the substrate, wherein the first supporting layer has a first surface;
   patterning the first supporting layer from the first surface of to form a plurality of trenches extending along a first direction;
   depositing a first pinning material layer conformal over the plurality of trenches;
   depositing a second supporting layer over the first pinning material layer to fill the plurality of trenches at least fully covering sidewalls of the plurality of trenches, wherein the first pinning material layer is disposed between the first supporting layer and the second supporting layer;
   polishing over the substrate at least on the second supporting layer and then the first pinning material layer until the first surface of the first supporting layer is exposed, wherein end surfaces of the first pinning material layer is exposed by the first surface, wherein the first supporting layer and the second supporting layer have at least a portion substantially equal in height at the first surface, wherein a height of each of the end surfaces of the first pinning material layer is higher than a height of the first surface; and
   forming at least one magnetic memory track over the first supporting layer, the first pinning material layer, and the second supporting layer, extending along a second direction, wherein the second direction is not the same as the first direction, wherein portions of the at least one magnetic memory track respectively at the end surfaces of the first pinning material layer are protrudent.

8. The method for fabricating magnetic shift register of claim 7, wherein the second supporting layer is also conformal over the plurality of trenches, and between the step of depositing the second supporting layer and the step of polishing over the substrate, further comprising:
   depositing a second pining material layer on the second supporting layer conformal over the plurality of trenches; and
   depositing a third supporting layer into the plurality of trenches,
   wherein the subsequent step of polishing over the substrate also polishes the third supporting layer and the second pining material layer.

9. The method for fabricating magnetic shift register of claim 8, further comprising depositing a dielectric layer over the first supporting layer, the first pinning material layer, the second supporting layer, the second pinning material, and the third supporting layer after the step of polishing the first supporting layer, wherein the magnetic memory track is formed on the dielectric layer.

10. The method for fabricating magnetic shift register of claim 7, wherein the magnetic memory track is a perpendicular magnetic anisotropy (PMA) material.

11. The method for fabricating magnetic shift register of claim 7, further comprising depositing a dielectric layer over the first material layer, the first pinning material layer and the second material layer after the step of polishing the first material layer, wherein the magnetic memory track is formed on the dielectric layer.

12. The method for fabricating magnetic shift register of claim 7, wherein second direction is perpendicular to the first direction.

* * * * *